United States Patent
Tai et al.

(10) Patent No.: US 7,037,861 B2
(45) Date of Patent: May 2, 2006

(54) METHOD AND APPARATUS FOR OXIDIZING NITRIDES

(75) Inventors: Hung-Ming Tai, Hsinchu (TW); Forest Shih-Sen Chien, Hsinchu (TW)

(73) Assignee: Industrial Technology Research Institute, Judung (TW)

(*) Notice: Subject to any disclaimer, the term of this patent is extended or adjusted under 35 U.S.C. 154(b) by 0 days.

(21) Appl. No.: 10/957,654

(22) Filed: Oct. 5, 2004

(65) Prior Publication Data

US 2005/0142891 A1 Jun. 30, 2005

(30) Foreign Application Priority Data

Dec. 25, 2003 (TW) .............................. 92136907 A

(51) Int. Cl.
*H01L 21/31* (2006.01)
(52) U.S. Cl. .............. 438/771; 438/792; 438/798; 438/769; 438/770; 438/772
(58) Field of Classification Search ............. 438/769, 438/770, 772, 771, 792, 798
See application file for complete search history.

(56) References Cited

U.S. PATENT DOCUMENTS 6,190,508 B1   2/2001   Peng et al. ............. 204/157.46
6,274,513 B1 * 8/2001   Gwo et al. .................. 438/771

OTHER PUBLICATIONS

T. Enomoto et. al.; *Thermal oxidation rate of a Si/sub 3/N/sub 4/ film and its masking effect against oxidation of silicon*; Japanese Journal of Applied Physics, Jun. 1978, vol. 17, No. 6.
S. D. Wolter et. al.; *X-ray photoelectron spectroscopy and x-ray diffraction study of the thermal oxide on gallium nitride*; American Institute of Physics, Appl. Phys. Lett. 70 (16), Apr. 21, 1997, pp. 2156-2158.
C. B. Vartuli et. al.; *High temperature surface degradation of III-V nitrides*; American Vacuum Society, J. Vac. Sci. Technol. 8 14(6), Nov./Dec. 1996, pp. 3523-3531.

(Continued)

*Primary Examiner*—George Fourson
*Assistant Examiner*—Julio J. Maldonado
(74) *Attorney, Agent, or Firm*—Bacon & Thomas, PLLC

(57) ABSTRACT

A method for oxidizing a nitride film is disclosed, which includes the steps of: providing a nitride film formed on an electrically conductive substrate; irradiating the nitride film with a light beam and getting close to the nitride film with a electrically conductive probe; and exerting a bias between the electrically conductive substrate and the electrically conductive probe. The method can oxidize the nitrides quickly and reduce the cost building a nano-structure in the nitride film. An apparatus for oxidizing a nitride film is also disclosed herewith.

11 Claims, 2 Drawing Sheets

OTHER PUBLICATIONS

Terrance B. Tripp; *The Anodic Oxidation of Silicon Nitride Films on Silicon*; J. Electrochen. Soc., vol. 117, No. 2, Feb. 1970, pp. 157-159.

F. S.-S. Chien et. al.; *Nanometer-scale conversion of $Si_3N_4$ to $SiO_x$*; American Institute of Physics, Applied physics Letter, vol. 76, No. 3, Jan. 17, 2000, pp. 360-362.

* cited by examiner

METHOD AND APPARATUS FOR OXIDIZING NITRIDES

BACKGROUND OF THE INVENTION

1. Field of the Invention

The present invention relates to a method and an apparatus for oxidizing nitrides, and more particularly, to a method and an apparatus for oxidizing nitrides in order to form a structure with nano-pattern in the nitrides.

2. Description of Related Art

Owing to the excellent dielectric property, nitrides have become important materials in the manufacture process of semiconductor devices. On the other hand, nitrides often act as masks in the process of manufacturing microstructures due to its high resistance against acids and bases. In addition, nitrides have also become one of the important optical materials in recent years because of their excellent optical property. For example, silicon nitride ($Si_3N_4$) can serve as an insulating layer in semiconductor devices as well as mask layer in a CMOS manufacturing process. On the other hand, aluminum nitride (AlN) is not only used for forming insulating layers of semiconductor devices, but also for forming heat conductive layers of the same devices. Furthermore, aluminum nitride can also be utilized in the manufacturing process of UV sensors.

Although a nitride film can be widely applied, the nitride film is not easy to be patterned because of its stable chemical property. Moreover, the oxidation rate of nitrides is very slow so that complex processes are required to oxidize or modify the nitride film for subsequent application. Therefore, it is difficult to carry out the oxidation process of a nitride film. For example, the temperature for transforming silicon nitride into silicon oxide by using conventional wet thermal oxidation technique is required to be as high as 1100° C. (with reference to T. Enomoto, R. Ando, H. Morita, and H. Nakayama, Jpn. J. Appl. Phys. Vol. 17, p. 1049 (1978)). On the other hand, gallium nitride can be transformed into gallium oxide by reacting with the hot air only when the reaction temperature is higher than 900° C. (with reference to S. D. Wolter, et al., Appl. Phys. Lett. Vol. 70, p. 2156 (1997)). However, heat also decomposes nitrides and thereby the film quality deteriorates through heating (with reference to C. B. Vartuli et al., J. Vac. Sci. Technol. B 14, p. 3523 (1996)). Even though there is alternative (e.g. anode electrolysis oxidation) for transforming nitride film into oxide film without heat, however, the oxidation rate of $Si_3N_4$ in conventional anode electrolysis oxidation process is too slow (with reference to T. B. Tripp, J. Electrochem. Soc. Vol. 117, p. 157 (1970)).

U.S. Pat. No. 6,190,508 discloses a method to enhance the oxidation probability of InAlN, InGaN and GaN with exposure of light. However, since the scope of oxidation is too large, it is hard to build a micro- or nano-structure without cooperating with a photolithography process. Recently, a method to oxidize nitrides on the conductive substrate by using scanning probe lithography is also suggested, which uses a voltage of 5V at ambient temperature [F. S. Chien, et al., Appl. Phys. Lett., Vol. 76, No. 3, p. 360 (2000)]. Through the oxidation illustrated above, the line width of the resulted silicon oxide can be shorter than 100 nanometers. Subsequently, owing to the high selectivity to acids or bases, careful etching can form a structure having a high aspect ratio and a line width shorter than 100 nanometers. In other words, the desired pattern can be "written" directly without using a mask. Consequently, the manufacturing cost can be lowered significantly. Although this method can oxidizes nitrides at an ambient temperature, it is not practical for application due to the shield of electronic field and the retardation of electron flow as the thickness of the oxidized film increases. Therefore, the chemical reaction will stop and the thickness of the oxidized scope will range in a few nanometers only.

SUMMARY OF THE INVENTION

The object of the present invention is to provide a method for oxidizing nitrides so that parts of the nitrides can be oxidized quickly, the thickness of oxidized nitrides can be increased, and the cost for building a nano-structure in the nitride film can be lowered down.

The object of the present invention is to provide an apparatus for oxidizing nitrides so that parts of the nitrides can be oxidized quickly, the thickness of oxidized nitrides can be increased, and the cost for building a nano-structure in the nitride film can be lowered down.

To achieve the object above-mentioned, the method for oxidizing nitrides of the present invention comprises the following steps. First, a nitride layer formed on an electrically conductive substrate is provided. Afterwards, the nitride layer is illuminated with a light source and approached by an electrically conductive probe. Finally, a bias is exerted between the electrically conductive substrate and the electrically conductive probe.

To achieve the object above-mentioned, the method for oxidizing nitrides of the present invention comprises the following steps. First, a nitride layer formed on an electrically conductive substrate is provided. Afterwards, the nitride layer is approached by an optical fiber, of which the surface is plated with an electrically conductive material. Finally, a bias is exerted between the electrically conductive substrate and the electrically conductive material.

To achieve the object above-mentioned, the apparatus for oxidizing nitrides of the present invention comprises a nitride layer formed on an electrically conductive substrate; a light source adjacent to the electrically conductive substrate for providing the energy that excites the nitrides; an electrically conductive probe close to the surface of said nitride layer for controlling the oxidation scope of the nitride layer; and a bias exerted between the electrically conductive substrate and the electrically conductive probe.

To achieve the object above-mentioned, the apparatus for oxidizing nitrides of the present invention comprises a nitride layer formed on an electrically conductive substrate; an optical fiber plated with an electrically conductive material and being close to the surface of the nitride layer for providing the energy that excites the nitrides and controlling the oxidation scope of the nitride layer; and a bias exerted between the electrically conductive substrate and the electrically conductive probe.

DETAILED DESCRIPTION OF THE PREFERRED EMBODIMENTS

The material of the nitride layer of the method and apparatus for oxidizing nitrides of the present invention can be any conventional nitrides. Preferably, the nitride layer is composed of $Si_3N_4$, oxynitride, $Ge_3N_4$, TiN, BN, AlN, GaN, InN, InGaN, InAlN, or AlInGaN. The electrically conductive substrate of the present invention can be made of any conventional conductive material used for making a substrate. Preferably, the electrically conductive substrate is made of a p-type or n-type silicon wafer, Ge, SiGe, InN, GaN, GaAs, InP, GaP, AlP, InAs, AlAs, AlGaAs, InGaAs, ZnSe, $In_2O_3$:Sn (Tin-doped Indium oxide, ITO), ZnO:F, ZnO:B, $SnO_2$:F, $ZnSnO_3$, $Zn_2SnO_4$, TiN, $Cd_2SnO4$, ZnO:Al, ZnO:Ga, ZnO:In, Ti, V, Cr, Mn, Fe, Co, Ni, Cu, Au, Zr, Nb, Mo, Rh, Ag, In, Se, Hf, Ta, W, Ir, Pt, Au or the combinations thereof. The light source of the present invention can be any kind of conventional light sources. Preferably, the light source is a Halogen lamp (254 nm), Nd-YAG (1064 nm, 1320 nm, 532 nm, 354 nm, 66 nm), XeCl (308 nm), XeF (351 nm), KrCl (222 nm), KrF (248 nm), ArF (193 nm), $F_2$ (157 nm), HeCd (325–441 nm), $N_2$ (337 nm, 428 nm), Ar (514.5 nm), $H_2$(110–162 nm), dye laser (400–800 nm), GaAs/GaAlAs (708–905 nm), HeNe (632 nm), high-pressure mercury lamp, deuterium lamp, or xenon lamp. The electrically conductive probe of the present invention can be any conventional electrically conductive probe. Preferably, the electrically conductive probe is a heavily doped silicon probe, a diamond-like probe, a tungsten probe, or a probe that is plated with a conductive metal. In the present invention, the way that the electrically conductive probe approaches the nitride layer is preferably in a contact mode, an intermittent contact mode, or a tapping mode. The way that the electrically conductive probe approaches the nitride layer is not restricted. Preferably, the electrically conductive probe is driven by a micro actuator to approach the nitride layer. The method and apparatus for oxidizing nitrides of the present invention can further be applied to the oxidation of phosphides, arsenides or metals. Preferably, the phosphides are InP, GaP, AlP, or BP; the arsenides are InAs, GaAs, or AlAs; and the metals are Al, Ti, or Zr. The electrically conductive material plated on the optical fiber of the present invention can be any conventional electrically conductive material. Preferably, the electrically conductive material is the conductive metal, the doped diamond, $WC_2$, or doped nitrides.

The following detailed description are given by way of example and not intended to limit the invention solely to the embodiments described herein.

Embodiment 1

Figure 1:
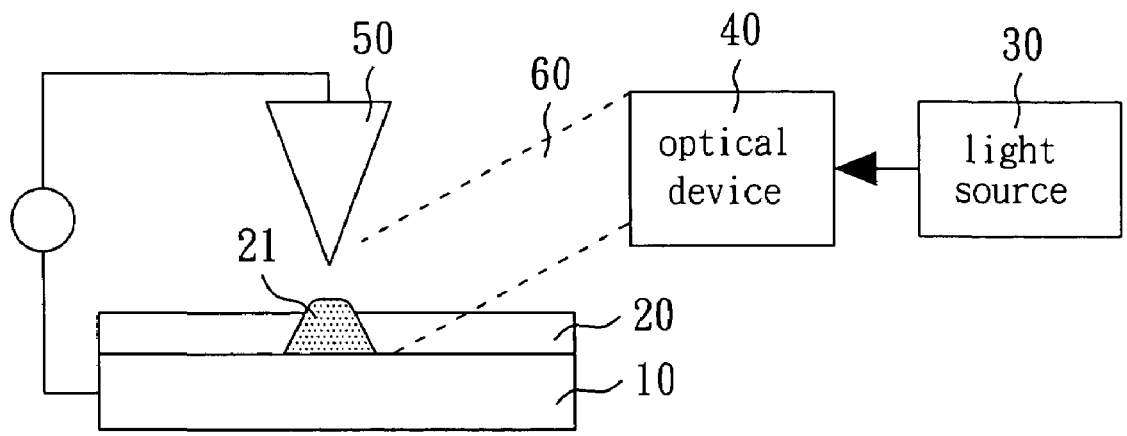
FIG. 1 is a schematic view showing a preferred embodiment of the apparatus for oxidizing nitrides of the present invention.
Figure 2:
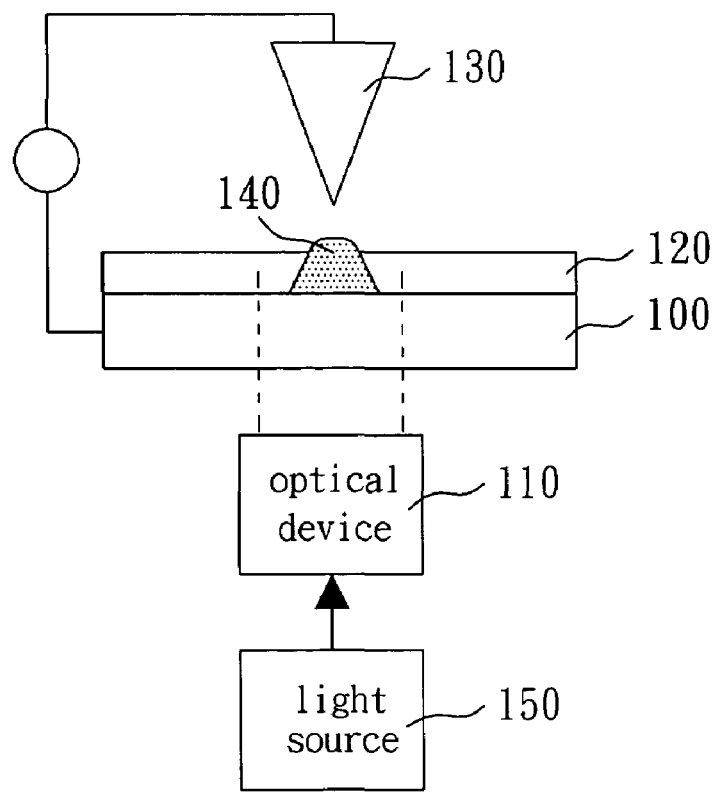
FIG. 2 is a schematic view showing another preferred embodiment of the apparatus for oxidizing nitrides of the present invention.

With reference to FIG. 1, a nitride film 20 with a thickness of 3–15 nanometers is formed on the p-type silicon wafer 10 by the chemical vapor deposition process. Afterwards, the p-type silicon wafer 10 having a nitride film 20 is put on the sample stage, which is electrically connected with the p-type silicon wafer 10. Moreover, a light source 30, such as a halogen lamp, emits the UV light with a wavelength of 254 nm onto the nitride film 20. If the wavelength of the UV light satisfies the following equation:

$$hv > E_g,$$

wherein h is the Plank constant, v is the frequency of the emitting light, and $E_g$ is the energy gap of nitride, and then the electron of the nitride is excited. Thereafter, the probability that the electron migrates from the valence band to the conductive band is increased, i.e. the probability for forming hot electrons and holes is increased. Even if the wavelength of the UV light does not satisfy the above equation and the hot electrons and holes are not formed, any other additional energy or lowered energy gap will also increase the probability of electron migration. It is optionally to mount an optical device 40 for adjusting the scope of the nitride film 20 that is illuminated by the UV light. Generally, the luminance of the UV light is kept at 10 $mW/cm^2$ or more. Subsequently, an electrically conductive probe 50 approaches the nitride film 20. The electrically conductive probe 50 can be a heavily-doped silicon probe, a diamond-like probe, or a probe that is plated with an electrically conductive metal used in the atomic force microscope (AFM), or a tungsten probe used in the scanning tunneling microscope (STM). The electrically conductive probe can be driven by an atomic force microscope or other micro-actuators to approach the nitride film 20. Preferably, an atomic force microscope is used to make the probe of the atomic force microscope approach the gallium nitride 20 in contact mode, intermittent contact mode or tapping mode. The contact position of the electrically conductive probe 50 on the nitride film 20 is within the scope 60 of the UV light. At the atmospheric environment, the water is adsorbed on the nitride film 20 to form a water film. When the electrically conductive probe 50 approaches the nitride film 20, a water bridge is naturally formed therebetween. Afterwards, a bias V is exerted between the electrically conductive probe 50 and the p-type silicon wafer 10, wherein the p-type silicon wafer 10 is at a high voltage, and the electrically conductive probe 50 is at a low voltage. Preferably, the bias and the wavelength of the UV light satisfy the equation $eV+hv>E_g$. Accordingly, the oxide 21 is formed between the nitride film 20 and the electrically conductive probe 50. Different voltage will result in oxide film having different height. By another way, if the bias is constant, the height of the oxide can be changed according to the exerting time of the bias.

Embodiment 2

This embodiment is quite similar to Embodiment 1, except that when the substrate 100 is transparent, the light source 150 can also be located below the substrate 100. The optical device 110 having a shutter controls the illumination of the light from the light source 150 to the nitride film 120, and the illumination time thereof is also a controlled variable. Let the bias and wavelength of the illuminating light satisfy the equation $eV+hv>E_g$, and then the oxide 140 can be formed between the nitride film 120 and the probe 130. Furthermore, the height of the oxide film can be adjusted by changing the wavelength, the illuminating time, or the luminance of the illuminating light.

Embodiment 3

Figure 3:
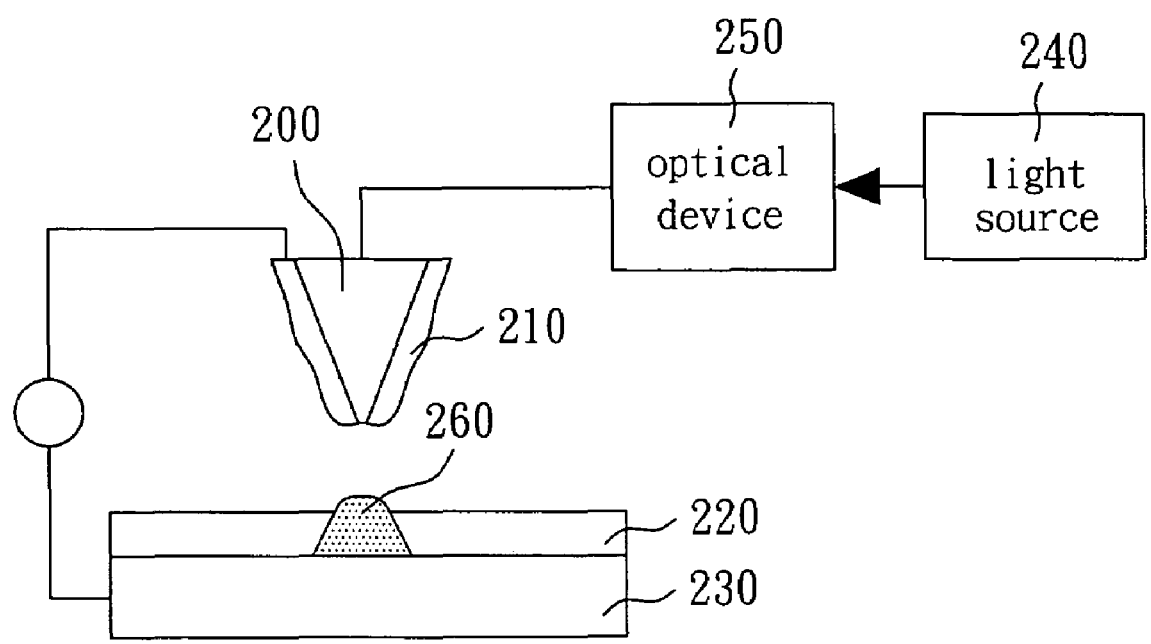
FIG. 3 is a schematic view showing the other preferred embodiment of the apparatus for oxidizing nitrides of the present invention.

With reference to FIG. 3, a probe made of optical fiber 200 (for example, the probe used in a Scanning Near-field Optical Microscope, SNOM) is plated with an electrically conductive material 210, such as conductive metals, the doped diamond, $WC_2$, or doped nitrides at its tip. Afterwards, let the optical fiber approach the nitride film 220 in a contact mode, an intermittent contact mode, or a tapping mode. Thereafter, a bias V is exerted between the electrically conductive material 210 and the substrate 230, wherein the substrate 230 is at high voltage, and the electrically conductive material 210 is at low voltage. Particularly, the bias V is less than the minimal critical voltage $V_0$ that can oxidize the nitride film. After the light coming from the light source 240 passes the optical device 250, it enters the optical fiber 210. The optical device 250 has a shutter, which controls whether the light illuminates on the nitride film 220 or nor, and the illuminating time of the light on the nitride film 220. Also, the optical device 250 can adjust the luminance of the light on the nitride film 220. Preferably, the bias and the wavelength of the illuminating light satisfy the equation $eV+hv>E_g$. Consequently, the oxide 260 is formed between the nitride film 220 and the optical fiber 210. Similarly, the height of the oxide film can be adjusted by changing the wavelength, the illuminating time, or the luminance of the illuminating light.

In those aforesaid embodiments, an exquisite structure can be obtained by carrying out a selective etching process after the nitride is oxidized. For example, the oxide may be removed by the wet etching process using HF, and then the nitride can serve as a mask. Or, the nitride may be removed by the dry etching process using the plasma, and then the oxide can serve as a mask. On the other hand, the nitride film can also be removed by the wet etching process using $H_3PO_4$, and then the oxide acts as a mask. Or the nitride is removed by the dry etching process using the plasma, and then the oxide acts as a mask. Finally, let the resulted structure serve as a mask in a selective etching process to enhance the aspect ratio. The etchant may be KOH, EDP (Ethylene Diamine Pyrocatechol), or TMAH (Tetra-methyl Ammonium Hydroxide) for the wet etching process, or the plasma for the dry etching process.

The present invention uses the light to illuminate and excite the electron of the nitride film, as well as the electrically conductive probe to generate a concentrated electric field above the nitride film. Due to the absorption of the photon energy, the electrons with higher dynamic energy thus migrate from the valence band to the conductive band. Thereafter, the electrons react with hydrogen ions on the probe, and the electric field and the electric holes aid the nitride near the probe to react with the hydroxide ions. Consequently, both the excited electrons and electric holes can accelerate the local oxidation reaction and increase the thickness of the oxide film.

While the present invention has been particularly shown and described with reference to the preferred embodiments, it will be readily appreciated by those of ordinary skill in the art that various changes and modifications may be made without departing from the spirit and scope of the invention. It is intended that the claims are interpreted to cover those disclosed embodiments, those alternatives which have been discussed above and all equivalents thereto.

What is claimed is:

1. A method for oxidizing nitrides, comprising following steps of:

Forming a nitride layer on an electrically conductive substrate;

illuminating said nitride layer with a light source and approaching said nitride layer with an electrically conductive probe; and applying a bias between said electrically conductive substrate and said electrically conductive probe.

2. The method as claimed in claim 1, wherein said nitride layer is made of $Si_3N_4$, oxynitride, $Ge_3N_4$, TiN, BN, AlN, GaN, InN, InGaN, InAlN, or AlInGaN.

3. The method as claimed in claim 1, wherein said electrically conductive substrate is made of p-type silicon wafer, n-type silicon wafer, Ge, SiGe, InN, GaN, GaAs, InP, GaP, AlP, InAs, AlAs, AlGaAs, InGaAs, ZnSe, $In_2O_3$:Sn (Tin-doped Indium oxide, ITO), ZnO:F, ZnO:B, $SnO_2$:F, $ZnSnO_3$, $Zn_2SnO_4$, TiN, $Cd_2SnO4$, ZnO:Al, ZnO:Ga, ZnO:In, Ti, V, Cr, Mn, Fe, Co, Ni, Cu, Au, Zr, Nb, Mo, Rh, Ag, In, Se, Hf, Ta, W, Ir, Pt, Au, or the alloys of above-mentioned metals.

4. The method as claimed in claim 1, wherein said light source is Halogen lamp (254 nm), Nd-YAG (1064 nm, 1320 nm, 532 nm, 354 nm, 66 nm), XeCl (308 nm), XeF (351 nm), KrCl (222 nm), KrF (248 nm), ArF (193 nm), $F_2$ (157 nm), HeCd (325–441 nm), $N_2$ (337 nm, 428 nm), Ar (514.5 nm), $H_2$ (110–162 nm), Dye laser (400–800 nm), GaAs/GaAlAs (708–905 nm), HeNe (632 nm), High-pressure mercury lamp, Deuterium lamp, or Xenon lamp.

5. The method as claimed in claim 1, wherein said electrically conductive probe is a heavily-doped silicon probe, a diamond-like probe, a tungsten probe, or a probe that is plated with a conductive metal.

6. The method as claimed in claim 1, wherein said electrically conductive probe approaches said nitride layer in a contact mode, an intermittent contact mode, or a tapping mode.

7. The method as claimed in claim 1, wherein a micro actuator drives said electrically conductive probe to approach said nitride layer.

8. The method as claimed in claim 1, further being applied to the oxidation of phosphides, arsenides, or metals.

9. The method as claimed in claim 8, wherein said phosphides is InP, GaP, AlP, or BP; said arsenides is InAs, GaAs, AlAs; and said metals are Al, Ti, or Zr.

10. A method for oxidizing nitrides, comprising steps of:

forming a nitride layer on an electrically conductive substrate;

approaching said nitride layer with an optical fiber, of which the surface is plated with an electrically conductive material; and applying a bias between said electrically conductive substrate and said electrically conductive material while illuminating the nitride layer.

11. The method as claimed in claim 10, wherein said electrically conductive material is electrically conductive material, doped diamond, $WC_2$, or doped nitride.

* * * * *